US012095349B2

(12) United States Patent
Murakami

(10) Patent No.: US 12,095,349 B2
(45) Date of Patent: Sep. 17, 2024

(54) SEMICONDUCTOR INTEGRATED CIRCUIT FOR POWER SUPPLY, AND POWER SUPPLY SYSTEM

(71) Applicant: Rohm Co., Ltd., Kyoto (JP)

(72) Inventor: Kazuhiro Murakami, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 185 days.

(21) Appl. No.: 17/800,278

(22) PCT Filed: Dec. 11, 2020

(86) PCT No.: PCT/JP2020/046324
§ 371 (c)(1),
(2) Date: Aug. 17, 2022

(87) PCT Pub. No.: WO2021/166389
PCT Pub. Date: Aug. 26, 2021

(65) Prior Publication Data
US 2023/0071364 A1    Mar. 9, 2023

(30) Foreign Application Priority Data

Feb. 20, 2020    (JP) .................. 2020-027062

(51) Int. Cl.
H02M 3/158    (2006.01)
H02M 1/00    (2006.01)
H02M 1/32    (2007.01)

(52) U.S. Cl.
CPC ......... *H02M 1/0025* (2021.05); *H02M 1/325* (2021.05); *H02M 3/158* (2013.01)

(58) Field of Classification Search
CPC ...... H02M 3/158; H02M 1/0025; H02M 1/32; H02M 1/325; H02M 1/36
See application file for complete search history.

(56) References Cited

U.S. PATENT DOCUMENTS

2005/0024033 A1*  2/2005  Nakata ............... H02M 1/36
                                                    323/282
2013/0307435 A1*  11/2013  Takagimoto .......... G05F 1/468
                                                    307/9.1

FOREIGN PATENT DOCUMENTS

JP    2000321334    11/2000
JP    2014003786    1/2014
JP    2016015833    1/2016

OTHER PUBLICATIONS

International Search Report in International Appln. No. PCT/JP2020/046324, dated Jan. 12, 2021, 5 pages (with English Translation).

* cited by examiner

*Primary Examiner* — Alex Torres-Rivera
(74) *Attorney, Agent, or Firm* — Fish & Richardson P.C.

(57) ABSTRACT

A semiconductor integrated circuit for power supply forming a power supply device generates an output voltage from an input voltage. The semiconductor integrated circuit includes a plurality of external terminals including a target external terminal; a target transistor disposed between the target external terminal and a reference conductive part having a predetermined reference potential; an output voltage monitoring circuit arranged to turn on or off the target transistor in accordance with the output voltage; and a constant current circuit arranged to supply a constant current to a point of the reference potential via the target external terminal.

9 Claims, 9 Drawing Sheets

SEMICONDUCTOR INTEGRATED CIRCUIT FOR POWER SUPPLY, AND POWER SUPPLY SYSTEM

TECHNICAL FIELD

The present disclosure relates to a semiconductor integrated circuit for power supply and a power supply system.

BACKGROUND ART

A power supply IC is often used for forming a power supply device, and the power supply IC is often provided with a power good terminal to inform an external device of an output voltage state of the power supply device. The power good terminal is usually connected to ground via a transistor having an open drain structure (see, for example, Patent Document 1, Paragraph 0031).

FIG. 13 illustrates a structure of a power supply system including first to third power supply ICs 910 and a power supply management device 920. The first to third power supply ICs 910 are used for forming first to third power supply devices, each of which generates an output voltage from an input voltage. Each of the power supply ICs 910 includes a transistor 911 constituted as an N-channel type MOSFET, and a power good terminal 912. In each power supply IC 910, a drain of the transistor 911 is connected to the power good terminal 912 and a source of the transistor 911 is connected to the ground. In each power supply device, when the output voltage is determined to be normal, the transistor 911 is turned off. When the output voltage is determined to be abnormal, the transistor 911 is turned on.

The power good terminals 912 of the first to third power supply ICs 910 are commonly connected to a wiring 930, which is connected to an application terminal of a positive power supply voltage via a pull-up resistor 931. The power supply management device 920 can detect presence or absence of abnormality in each output voltage by monitoring the voltage of the wiring 930.

LIST OF CITATIONS

Patent Literature

Patent Document 1: JP-A-2016-15833

SUMMARY OF THE DISCLOSURE

Technical Problem

In each power supply IC 910, when the output voltage is normal, the power good terminal 912 is in a high-impedance state viewed from the wiring 930, and when the power good terminal 912 and the wiring 930 are disconnected due to a soldering defect or the like, a state equivalent to the high-impedance state described above will occur. In other words, the power supply management device 920 cannot discriminate between the normal state of the output voltage and the failed state due to disconnection between the power good terminal 912 and the wiring 930, and hence it cannot detect the latter failed state.

It is an object of the present disclosure to provide a semiconductor integrated circuit for power supply and a power supply system that can detect a failure in connection between a terminal and a wiring.

Means for Solving the Problem

A semiconductor integrated circuit for power supply according to the present disclosure is a semiconductor integrated circuit for power supply arranged to form a power supply device that generates an output voltage from an input voltage, and is equipped with a plurality of external terminals including a target external terminal, a target transistor disposed between the target external terminal and a reference conductive part having a predetermined reference potential, an output voltage monitoring circuit that turns on or off the target transistor in accordance with the output voltage, and a constant current circuit that supplies a constant current to a point of the reference potential via the target external terminal (first structure).

A power supply system according to the present disclosure is a power supply system including a plurality of power supply devices each of which has the semiconductor integrated circuit for power supply according to the first structure described above, so as to generate an output voltage from an input voltage. The power supply system includes a target wiring to be commonly connected to a plurality of the target external terminals provided to a plurality of the semiconductor integrated circuits for power supply of the plurality of power supply devices, a pull-up resistor connected between the target wiring and an application terminal of a predetermined positive power supply voltage, and a power supply management device that monitors voltage of the target wiring as a monitoring target voltage. The power supply management device includes a comparison determination circuit that compares the monitoring target voltage with a plurality of criteria voltages (second structure).

The power supply system according to the second structure described above may have a structure, in which the output voltage monitoring circuit of each power supply device determines normality or abnormality of the output voltage, and turns off the target transistor when determining that the output voltage is normal while turns on the target transistor when determining that the output voltage is abnormal (third structure).

The power supply system according to the third structure described above may have a structure, in which the output voltage monitoring circuit of each power supply device turns on or off the target transistor based on a high-low relationship between a set voltage and a feedback voltage corresponding to the output voltage (fourth structure).

The power supply system according to the third or fourth structure described above may have a structure, in which the plurality of criteria voltages include a first criteria voltage having a potential higher than the reference potential and a second criteria voltage higher than the first criteria voltage and lower than the power supply voltage. On the basis of comparison results between the monitoring target voltage and the first criteria voltage and between the monitoring target voltage and the second criteria voltage, the comparison determination circuit outputs a normal determination signal if the monitoring target voltage is higher than the first criteria voltage and is lower than the second criteria voltage, while it outputs an abnormal determination signal if the monitoring target voltage is lower than the first criteria voltage or is higher than the second criteria voltage (fifth structure).

The power supply system according to the fifth structure described above may have a structure, in which the comparison determination circuit outputs a first abnormal determination signal if the monitoring target voltage is lower than the first criteria voltage, and outputs a second abnormal determination signal different from the first abnormal determination signal if the monitoring target voltage is higher than the second criteria voltage (sixth structure).

The power supply system according to any one of the second to sixth structures described above may have a structure, in which the plurality of constant current circuits disposed in the plurality of semiconductor integrated circuits for power supply generate the constant currents having the same current value (seventh structure).

The power supply system according to any one of the second to sixth structures described above may have a structure, in which the plurality of constant current circuits disposed in the plurality of semiconductor integrated circuits for power supply generate the constant currents having different current values (eighth structure).

The power supply system according to the eighth structure described above may have a structure, in which the plurality of criteria voltages are three or more different criteria voltages within a voltage range from the reference potential voltage to the power supply voltage (ninth structure).

The power supply system according to the ninth structure described above may have a structure, in which the voltage range is divided into four or more voltage ranges by the three or more criteria voltages as boundaries. The comparison determination circuit compares the monitoring target voltage with the three or more criteria voltages so as to determine which one of the four or more voltage ranges the monitoring target voltage belongs to, and outputs a signal corresponding to the determination result (tenth structure).

Advantageous Effects of the Disclosure

According to the present disclosure, it is possible to provide a semiconductor integrated circuit for power supply and a power supply system that can detect a failure in connection between a terminal and a wiring.

DESCRIPTION OF EMBODIMENTS

Hereinafter, examples of an embodiment of the present disclosure are described in detail with reference to the drawings. In the referred drawings, the same part is denoted by the same numeral or symbol, and overlapping description of the same part is omitted as a rule. Note that in this specification, for simple description, when referring to a symbol or code of information, a signal, a physical quantity, an element, a part, or the like, a name thereof may be omitted or abbreviated. For instance, a target transistor denoted by 32 (see FIG. 5) may be referred to as a target transistor 32 or a transistor 32 in short, both of which indicate the same thing.

First, some terms used for describing the embodiment of the present disclosure are defined below. An IC is an abbreviation of an integrated circuit. A ground means a conductive part having a potential of 0 V (zero volts) to be a reference or 0 V potential itself. The 0 V potential may be referred to as a ground potential. In the embodiment of the present disclosure, a voltage referred to without a specific reference indicates a potential with respect to the ground.

A level means a potential level, and for an arbitrary signal or voltage, high level has a potential higher than low level. For an arbitrary signal or voltage, that the signal or voltage is at high level means that the level of the signal or voltage is at high level, while that the signal or voltage is at low level means that the level of the signal or voltage is at low level. A level of a signal may be referred to as a signal level, and a level of a voltage may be referred to as a voltage level.

For an arbitrary transistor constituted as a field effect transistor (FET) including a MOSFET, an ON state means a state where the drain and source of the transistor are electrically connected, while an OFF state means a state where the drain and source of the transistor are electrically disconnected (a cut-off state). The same is true for transistors that are not classified as the FET. The MOSFET is understood to be an enhancement type MOSFET unless otherwise specified. "MOSFET" is an abbreviation of metal-oxide-semiconductor field-effect transistor. For an arbitrary MOSFET described below, the backgate is connected to the source unless otherwise noted. In the following description, for an arbitrary transistor, the ON state and the OFF state may be simply referred to as ON and OFF, respectively.

Figure 1:
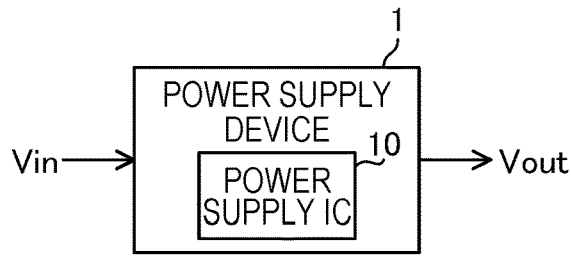
FIG. 1 is a schematic structural diagram of a power supply device according to an embodiment of the present disclosure.

A power supply device 1 illustrated in FIG. 1 according to the embodiment of the present disclosure is described below. The power supply device 1 generates an output voltage Vout from an input voltage Vin. The power supply device 1 includes a power supply IC 10. The power supply IC 10 consists of a semiconductor integrated circuit for power supply that constitutes the power supply device 1. The input voltage Vin and the output voltage Vout may be positive voltages or may be negative voltages. Here, the input voltage Vin and the output voltage Vout are positive DC voltages.

The power supply device 1 may be a series regulator or may be a switching regulator. If the power supply device 1 is the switching regulator, the power supply device 1 may be a step-up type DC/DC converter that steps up the input voltage Vin so as to generate the output voltage Vout higher than the input voltage Vin, or may be a step-down type DC/DC converter that steps down the input voltage Vin so as to generate the output voltage Vout lower than the input voltage Vin. In addition, the power supply device 1 may be a step-up/down type DC/DC converter that can step up and down the input voltage Vin. The power supply device 1 may be an isolation type power supply device that uses a transformer to generate the output voltage Vout isolated from the input voltage Vin, on the basis of the input voltage Vin.

Figure 2:
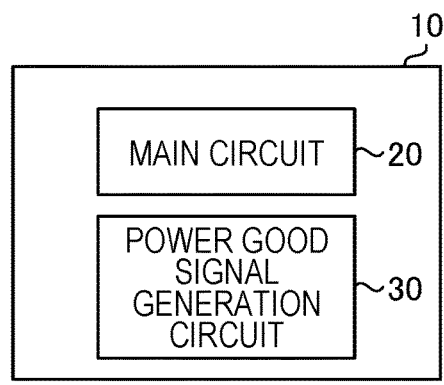
FIG. 2 is a schematic functional block diagram of a power supply IC according to the embodiment of the present disclosure.

As illustrated in FIG. 2, the power supply IC 10 includes a main circuit 20 and a power good signal generation circuit 30 (hereinafter may be referred to as a signal generation circuit 30). The main circuit 20 is a circuit that performs operation to generate the output voltage Vout based on the input voltage Vin. The signal generation circuit 30 is a circuit that generates and outputs a signal corresponding to the output voltage Vout (a power good signal).

Figure 3:
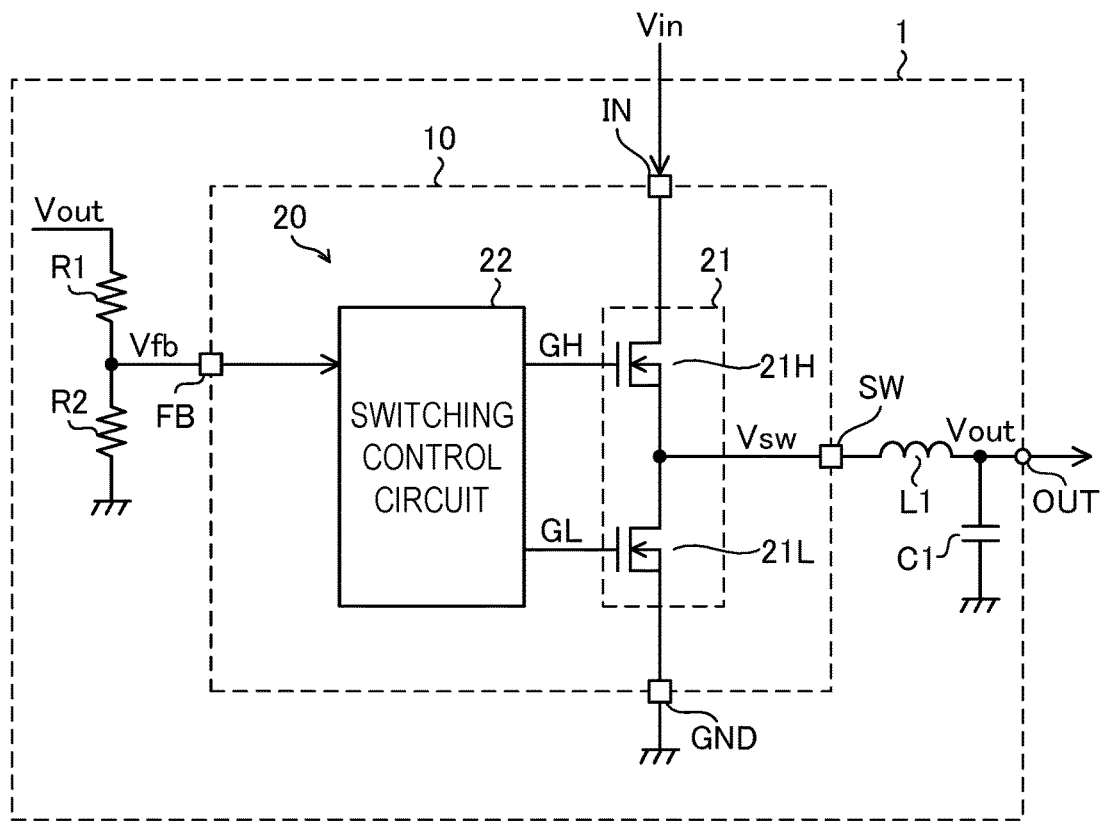
FIG. 3 is a diagram illustrating an internal structure example of the power supply device according to the embodiment of the present disclosure.

FIG. 3 illustrates a structural example of the main circuit 20. In the structural example of FIG. 3, it is supposed that the power supply device 1 is the step-down type DC/DC converter.

The power supply device 1 illustrated in FIG. 3 includes the power supply IC 10, a plurality of discrete components attached externally to the IC 10. The plurality of discrete components includes a capacitor C1 as an output capacitor, resistors R1 and R2 as feedback resistors, and a coil L1. The power supply device 1 of FIG. 3 generates a desired output voltage Vout from the input voltage Vin that is supplied from outside. The output voltage Vout is generated at an output terminal OUT. In other words, the output terminal OUT is an application terminal of the output voltage Vout (a terminal applied with the output voltage Vout). The output voltage Vout is supplied to an arbitrary load (not shown) connected to the output terminal OUT. In the power supply device 1 of FIG. 3, the input voltage Vin and the output voltage Vout are positive DC voltages, and the output voltage Vout is lower than the input voltage Vin. For instance, if the input voltage Vin is 12 V, the output voltage Vout can be stabilized at a desired positive voltage value (such as 3.3 V or 5 V) lower than 12 V by adjusting resistance values of the resistors R1 and R2.

Figure 4:
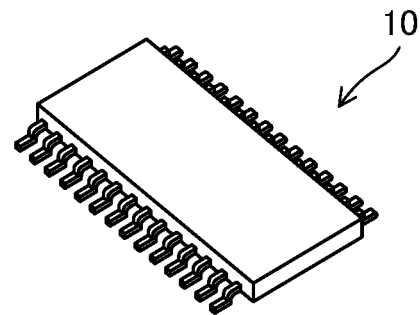
FIG. 4 is an external perspective view of the power supply IC according to the embodiment of the present disclosure.

The power supply IC 10 is an electronic component (semiconductor device) as illustrated in FIG. 4, which includes a semiconductor integrated circuit sealed in a package made of resin. A plurality of external terminals are exposed from the package of the power supply IC 10. In the power supply IC 10 according to the structural example of FIG. 3, the plurality of external terminals described above include an input terminal IN, a switch terminal SW, a feedback terminal FB, and a ground terminal GND, which are illustrated in FIG. 3, and also include a power good terminal PG described later (see FIG. 5). Other terminals can be included in the plurality of external terminals described above. Note that the number of the external terminals of the power supply IC 10 and the appearance of the power supply IC 10 illustrated in FIG. 4 are merely examples.

The input voltage Vin is supplied to the input terminal IN from outside of the power supply IC 10. The coil L1 is connected between the switch terminal SW and the output terminal OUT in series. In other words, one end of the coil L1 is connected to the switch terminal SW, and the other end of the coil L1 is connected to the output terminal OUT. In addition, the output terminal OUT is connected to one end of the capacitor C1, and the other end of the capacitor C1 is connected to the ground. Therefore, the output voltage Vout is applied between both ends of the capacitor C1. Further, the output terminal OUT is connected to one end of the resistor R1, and the other end of the resistor R1 is connected to the ground via the resistor R2. A connection node between the resistors R1 and R2 is connected to the feedback terminal FB. The ground terminal GND is connected to the ground.

The power supply IC 10 according to the structural example of FIG. 3 includes an output stage circuit 21 and a switching control circuit 22 that controls the output stage circuit 21, as components of the main circuit 20.

The output stage circuit 21 includes transistors 21H and 21L constituted as N-channel type metal oxide semiconductor field effect transistors (MOSFETs). The transistors 21H and 21L are a pair of switching elements connected in series between the input terminal IN and the ground terminal GND (i.e. the ground), and are switching-driven so that the input voltage Vin is switched, and a switch voltage Vsw having a rectangular waveform appears at the switch terminal SW. The transistor 21H is disposed on the high side, while the transistor 21L is disposed on the low side. Specifically, a drain of the transistor 21H is connected to the input terminal IN that is an application terminal of the input voltage Vin. A source of the transistor 21H and a drain of the transistor 21L are commonly connected to the switch terminal SW. A source of the transistor 21L is connected to the ground. However, a current detection resistor may be inserted between the source of the transistor 21L and the ground.

The transistor 21H functions as an output transistor, and the transistor 21L functions as a synchronous rectifier transistor. The coil L1 and the capacitor C1 constitute a rectifying and smoothing circuit that rectifies and smooths the switch voltage Vsw having a rectangular waveform at the switch terminal SW so as to generate the output voltage Vout. The resistors R1 and R2 constitute a voltage divider circuit that divides the output voltage Vout, and a feedback voltage Vfb that is a divided voltage of the output voltage Vout is generated at the connection node between the resistors R1 and R2. The connection node between the resistors R1 and R2 is connected to the feedback terminal FB, and the feedback voltage Vfb is input to the feedback terminal FB.

Gates of the transistors 21H and 21L are applied with gate signals GH and GL as drive signals, respectively, and the transistors 21H and 21L are turned on and off by the gate signals GH and GL. When the gate signal GH is at high level, the transistor 21H is in the ON state, while when the gate signal GH is at low level, the transistor 21H is in the OFF state. Similarly, when the gate signal GL is at high level, the transistor 21L is in the ON state, while when the gate signal GL is at low level, the transistor 21L is in the OFF state. Basically, the transistors 21H and 21L are alternately turned on and off, but both the transistors 21H and 21L may be maintained in the OFF state. The transistors 21H and 21L are not simultaneously in the ON state.

The switching control circuit 22 controls the ON/OFF state of each of the transistors 21H and 21L by level control of the gate signals GH and GL based on the feedback voltage Vfb, so that the output voltage Vout corresponding to the feedback voltage Vfb is generated at the output terminal OUT. For instance, the transistors 21H and 21L are alternately turned on and off so that the feedback voltage Vfb agrees with a reference voltage having a predetermined positive voltage value, and hence the output voltage Vout is stabilized at a predetermined target voltage Vtg (e.g. 3.3 V or 5 V) based on the reference voltage.

Note that it is supposed in the structural example of FIG. 3 that a synchronous rectification method is used, but a diode rectification method may be used in the output stage circuit 21. If the diode rectification method is used, the transistor 21L is eliminated from the output stage circuit 21, and instead, a synchronous rectification diode (not shown) is disposed in the output stage circuit 21, so that the anode is connected to the ground while the cathode is connected to the switch terminal SW. Each of the transistor 21L and the synchronous rectification diode functions as a rectifying element, which guides current based on accumulated energy in the coil L1 from the ground to the output terminal OUT, when the transistor 21H (the output transistor) is in the OFF state.

Figure 5:
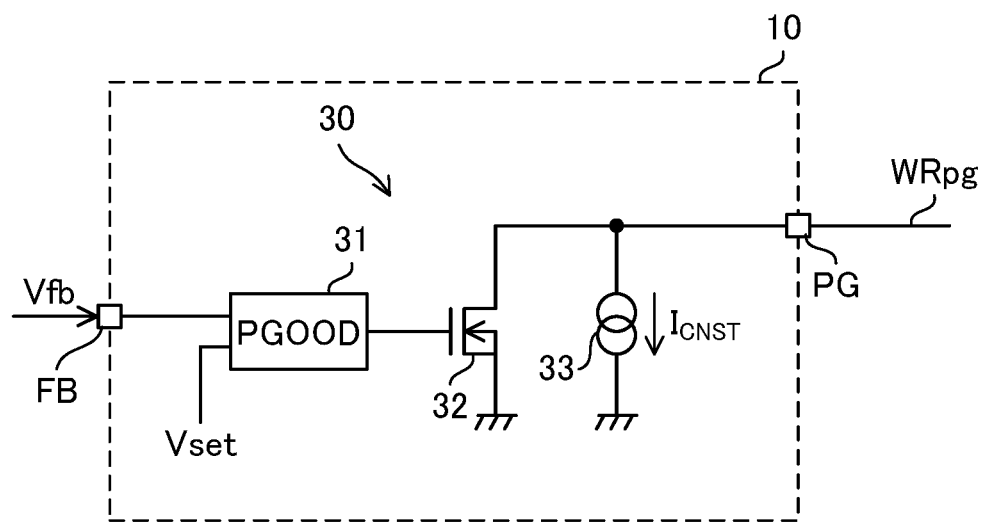
FIG. 5 is a diagram illustrating a structural example of a power good signal generation circuit of the power supply IC according to the embodiment of the present disclosure.

FIG. 5 illustrates a structural example of the power good signal generation circuit 30. The signal generation circuit 30 includes a power good circuit 31, a target transistor 32 constituted as an N-channel type MOSFET, and a constant current circuit 33.

The power good circuit 31 is an example of an output voltage monitoring circuit that monitors the output voltage Vout. The power good circuit 31 determines whether the output voltage Vout is normal or abnormal, and it turns off the target transistor 32 when determining that the output voltage Vout is normal, while it turns on the target transistor 32 when determining that the output voltage Vout is abnormal. Here, the feedback voltage Vfb and a set voltage Vset are input to the power good circuit 31, and the normality or abnormality of the output voltage Vout is determined on the basis of a high-low relationship between the feedback voltage Vfb and the set voltage Vset. When the structural example of FIG. 3 is adopted, the divided voltage of the output voltage Vout is input as the feedback voltage Vfb to the power good circuit 31, but the output voltage Vout itself may be input as the feedback voltage Vfb to the power good circuit 31. In any case, the feedback voltage Vfb can be any voltage that is proportional to the output voltage Vout.

The set voltage Vset is a predetermined voltage generated from the input voltage Vin in the power supply IC 10 and has a fixed positive DC voltage value (e.g. 600 mV). The power good circuit 31 is connected to a gate of the target transistor 32, and controls a gate potential of the target transistor 32 in accordance with the high-low relationship between the feedback voltage Vfb and the set voltage Vset, so as to control a state of the target transistor 32. Specifically, the power good circuit 31 includes a comparator that compares the feedback voltage Vfb with the set voltage Vset. If the feedback voltage Vfb is higher than the set voltage Vset, the power good circuit 31 determines that the output voltage Vout is normal, and supplies a low level signal from the comparator described above to the gate of the target transistor 32 so that the target transistor 32 is in the OFF state. If the feedback voltage Vfb is lower than the set voltage Vset, the power good circuit 31 determines that the output voltage Vout is abnormal, and supplies a high level signal from the comparator described above to the gate of the target transistor 32 so that the target transistor 32 is in the ON state. If Vfb=Vset is satisfied, the level of the signal supplied from the comparator described above to the gate of the target transistor 32 becomes one of the low level and the high level, and hence the target transistor 32 becomes one of the OFF state and the ON state. In reality, the comparator described above is provided with a hysteresis characteristic. In a relationship between the output voltage Vout and the target voltage Vtg, if Vout=Vtg×k is satisfied, Vfb=Vset is satisfied. The coefficient k has a positive predetermined value smaller than 1, and for example, k is 0.8.

A drain of the target transistor 32 is connected to the power good terminal PG that is one of the external terminals of the power supply IC 10, and a source of the target transistor 32 is connected to the ground. In other words, the target transistor 32 having an open drain structure is connected to the power good terminal PG. The power good terminal PG is connected to a wiring WRpg that is a target wiring disposed outside the power supply IC 10.

The constant current circuit 33 is disposed between the power good terminal PG and the ground, and works to flow a constant current $I_{CNST}$ from the power good terminal PG to the ground. The wiring WRpg is pulled up as described later, and the constant current $I_{CNST}$ is drawn into the power supply IC 10 via the wiring WRpg.

Figure 6:
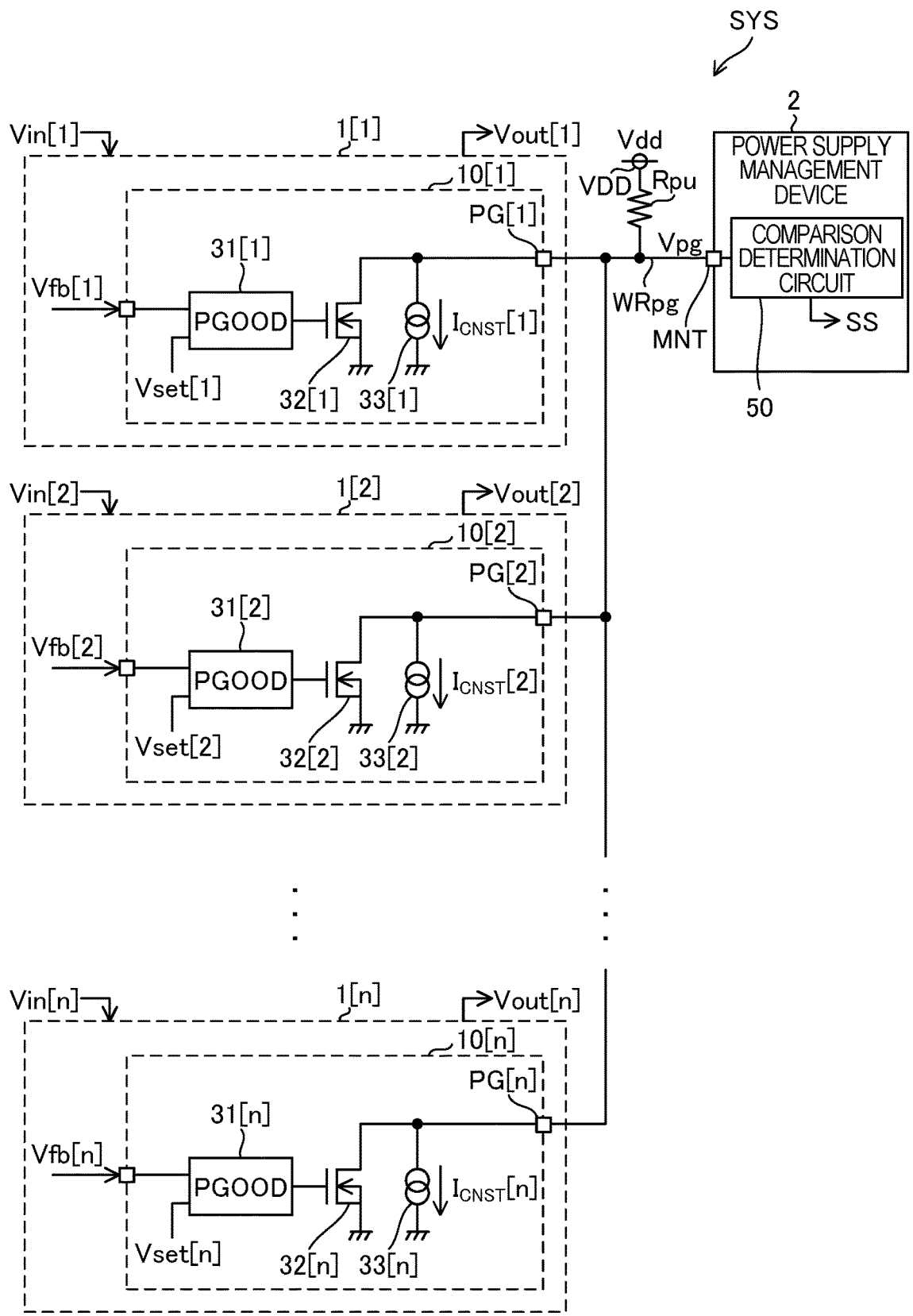
FIG. 6 is a partial structural diagram of a power supply system according to the embodiment of the present disclosure.

FIG. 6 illustrates a power supply system SYS according to the embodiment of the present disclosure. The power supply system SYS includes total n power supply devices 1 and a power supply management device 2. Here n is an arbitrary integer more than 1. When discriminating the n power supply devices 1 from each other, they are referred to as power supply devices 1[1] to 1[n]. Further, if necessary, the input voltage Vin and the output voltage Vout in the power supply device 1[i] are denoted specifically by Vin[i] and Vout[i], respectively, and the power supply IC 10 and the power good terminal PG in the power supply device 1[i] are denoted specifically by 10[i] and PG[i], respectively. Here i is an arbitrary natural number. Similarly, if necessary, the feedback voltage Vfb, the set voltage Vset, and the constant current $I_{CNST}$ in the power supply device 1[i] are denoted specifically by Vfb[i], Vset[i], and $I_{CNST}$[i], respectively. Similarly, if necessary, the power good circuit 31, the target transistor 32, and the constant current circuit 33 in the power supply device 1[i] are denoted specifically by 31[i], 32[i], and 33[i], respectively.

The input voltages Vin[1] to Vin[n] may be the same input voltage, or any two or more input voltages among the input voltages Vin[1] to Vin[n] may be different input voltages.

The target voltage Vtg of the power supply device 1[i] is denoted by Vtg[i]. The target voltages Vtg[1] to Vtg[n] may have the same voltage value, or any two or more target voltages among the target voltages Vtg[1] to Vtg[n] may have different voltage values. Therefore, when the output voltages Vout[1] to Vout[n] are stabilized at the target voltages Vtg[1] to Vtg[n], the output voltages Vout[1] to Vout[n] may have the same voltage value, or any two or more output voltages among the output voltages Vout[1] to Vout[n] may have different voltage values.

The power supply devices 1[1] to 1[n] may have the same specific structure. In this case, for example, the power supply devices 1[1] to 1[n] may have the structure illustrated in FIGS. 3 and 5. Among the power supply devices 1[1] to 1[n], any two or more power supply devices may have different specific structures. For instance, the power supply device 1[1] may be constituted as a step-down type DC/DC converter having the structure of FIG. 3 and FIG. 5, while the power supply device 1[2] may be constituted as a step-up type DC/DC converter.

However, in any case, in each of the power supply devices 1[1] to 1[n], the target transistor 32 and the constant current circuit 33 are connected in parallel between the power good terminal PG and the ground. In other words, in the power supply device 1[1], the target transistors 32[1] and the constant current circuit 33[1] are connected in parallel between the power good terminal PG[1] and the ground, and in the power supply device 1[2], the target transistor 32[2] and the constant current circuit 33[2] are connected in parallel between the power good terminal PG[2] and the ground, and thus in the power supply device 1[n], the target transistor 32[n] and the constant current circuit 33[n] are connected in parallel between the power good terminal PG[n] and the ground.

Using an arbitrary natural number i equal to smaller than n for generalization, a drain of the target transistor 32[i] is connected to the power good terminal PG[i], a source of the target transistor 32[i] is connected to the ground, and the constant current circuit 33[i] is disposed between the power good terminal PG[i] and the ground, so as to generate a constant current $I_{CNST}[i]$ that is to follow from the power good terminal PG[i] to the ground (if a connection abnormality described later of the power good terminal PG[i] has occurred, the constant current $I_{CNST}[i]$ does not follow). In the following description, for specific description, unless otherwise noted, each of the power good signal generation circuits 30 of the power supply devices 1[1] to 1[n] has the structure illustrated in FIG. 5.

The power good terminals PG[1] to PG[n] are commonly connected to the wiring WRpg unless a connection failure occurs. The connection failure in this case means a failure (defective connection) in which one or more of the power good terminals PG[1] to PG[n] and the wiring WRpg are disconnected.

The power supply device 1[i] is formed by mounting electronic components of the power supply device 1[i] on a predetermined printed circuit board (not shown) having many lands and patterns, and the power good terminal PG[i] of the power supply IC 10[i] is soldered to a corresponding land on the printed circuit board, so that connection between the power good terminal PG[i] and the wiring WRpg is realized. For instance, if a defect occurs in the soldering, a defective connection occurs between the power good terminal PG[i] and the wiring WRpg, resulting in a connection failure in which the power good terminal PG[i] and the wiring WRpg are disconnected. Without limiting to the soldering defect, any failure in which one or more of the power good terminals PG[1] to PG[n] and the wiring WRpg are disconnected due to any failure factor belongs to the connection failure.

In the power supply system SYS, a terminal VDD is an application terminal of a predetermined positive power supply voltage Vdd (a terminal to which the power supply voltage Vdd is applied). A pull-up resistor Rpu is disposed between the application terminal VDD of the power supply voltage Vdd and the wiring WRpg. In other words, the wiring WRpg is connected to the application terminal VDD of the power supply voltage Vdd via the pull-up resistor Rpu. The voltage at the wiring WRpg is referred to as a monitoring target voltage Vpg.

The power supply management device 2 is a power management IC that includes a monitoring terminal MNT and a comparison determination circuit 50, and has a function of monitoring the monitoring target voltage Vpg. Similarly to the power supply IC 10, the power supply management device 2 is an electronic component (semiconductor device), which includes a semiconductor integrated circuit sealed in a package made of resin. A plurality of external terminals are exposed from the package of the power supply management device 2, and the monitoring terminal MNT is one of the plurality of external terminals provided to the power supply management device 2. The monitoring terminal MNT is connected to the wiring WRpg.

The comparison determination circuit 50 determines normality or abnormality of the power supply system SYS on the basis of the monitoring target voltage Vpg applied to the monitoring terminal MNT, and outputs a signal SS corresponding to the determination result. Abnormalities of the power supply system SYS include an abnormality of any of the output voltages Vout[1] to Vout[n] (corresponding to a first abnormal state described later) and an abnormality due to the connection failure described above (corresponding to a second abnormal state described later), and the comparison determination circuit 50 can detect presence or absence of the former abnormality and the latter abnormality.

In first to seventh examples described below, a structural example of the comparison determination circuit 50, and application techniques, variation techniques, and the like of the power supply system SYS are described. The above description of this embodiment is applied to the first to seventh examples described below unless otherwise noted and unless a contradiction occurs. In interpretation of description of each example described later, if there is a contradiction with the above description, the description of each example may be prioritized. In addition, unless a contradiction occurs, description of any one of the first to seventh examples can be applied to any other example (i.e. any two or more of the plurality of examples can be combined).

First Example

Figure 7:
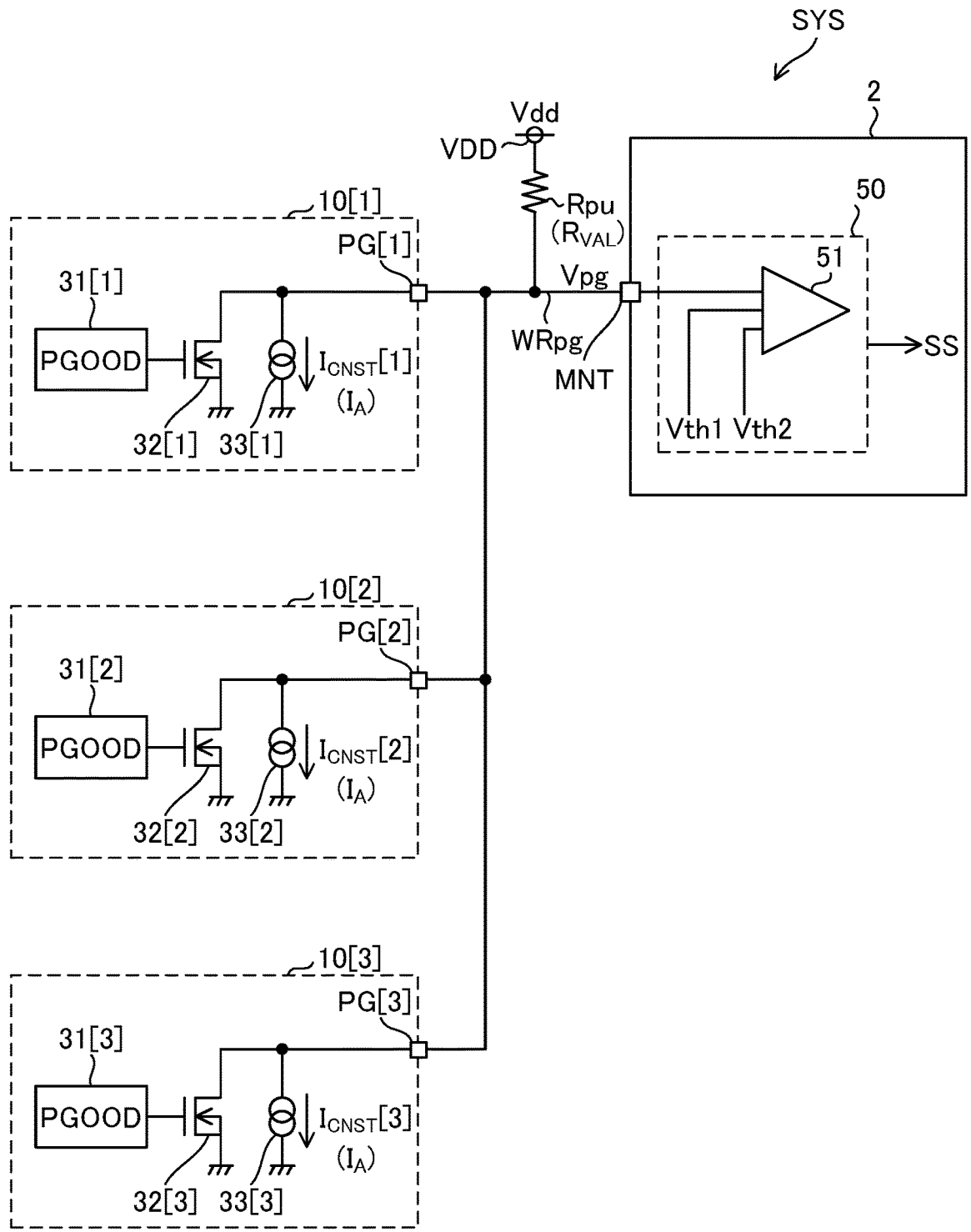
FIG. 7 is a partial structural diagram of the power supply system in a first example according to the embodiment of the present disclosure.

The first example is described below. FIG. 7 is a partial structural diagram of the power supply system SYS according to the first example. In the first example, it is supposed that n is 3, and that the constant currents $I_{CNST}[1]$ to $I_{CNST}[3]$ all have a current value $I_A$. In addition, a resistance value of the pull-up resistor Rpu is denoted by $R_{VAL}$. The comparison determination circuit 50 in the first example includes a comparator 51, and the comparator 51 is supplied with inputs of the monitoring target voltage Vpg and predetermined criteria voltages Vth1 and Vth2.

In the first example, the comparator 51 compares the monitoring target voltage Vpg with each of the criteria voltages Vth1 and Vth2. The comparison determination circuit 50 outputs the signal SS corresponding to the comparison results of the comparator 51.

Figure 8:
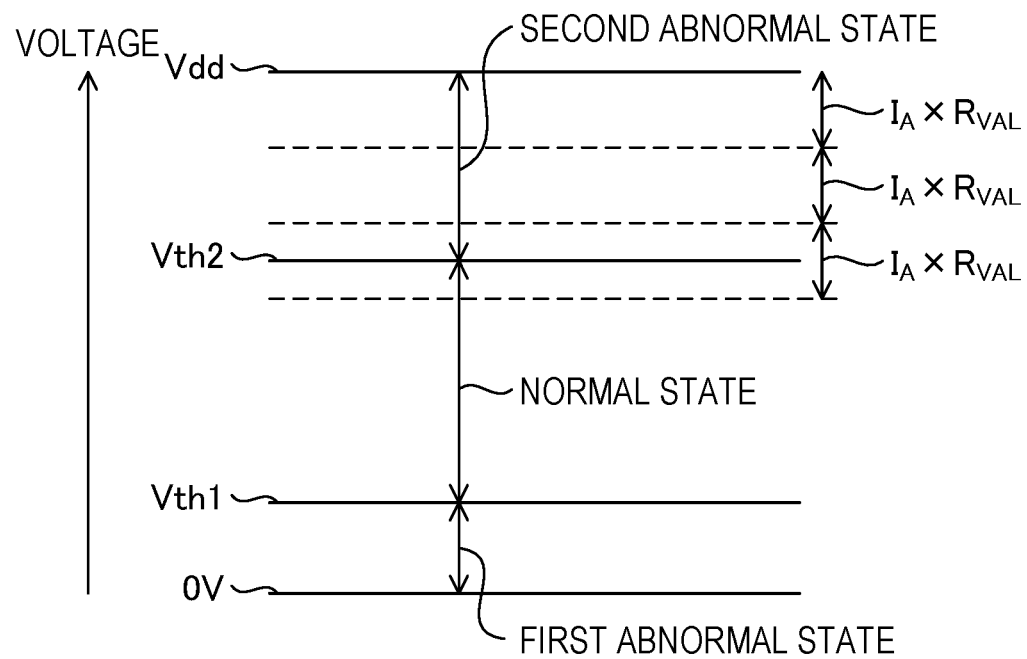
FIG. 8 is a diagram illustrating a high-low relationship among a plurality of voltages in the first example according to the embodiment of the present disclosure.

FIG. 8 illustrates a high-low relationship among the power supply voltage Vdd (e.g. 5 V), the reference potential voltage (i.e. 0 V), and the criteria voltages Vth1 and Vth2. The criteria voltage Vth1 has a predetermined first voltage value (e.g. 1.5 V) higher than 0 V, and the criteria voltage Vth2 has a predetermined second voltage value (e.g. 3.5 V) that is higher than the criteria voltage Vth1 and is lower than the power supply voltage Vdd.

The normal state of the power supply system SYS means the state where any of the connection failures described above has not occurred, and the target transistors 32[1] to 32[3] are all turned off. In this case, in each of the power supply ICs 10[1] to 10[3], the constant current circuit 33[i] flows the constant current $I_{CNST}[i]$ of the current value $I_A$ to the ground via the pull-up resistor Rpu and the power good terminal PG[i]. Therefore, in the normal state, Vpg=Vdd−$3 \times I_A \times R_{VAL}$ is satisfied.

Here, values of the criteria voltages Vth1 and Vth2 and a value of the pull-up resistor Rpu are set so that $0 < Vth1 < Vdd - 3 \times I_A \times R_{VAL} < Vth2 < Vdd$ is satisfied, and that the monitoring target voltage Vpg when any of the target transistors 32[1] to 32[3] is turned on in the state without a connection failure is lower than the criteria voltage Vth1.

In the power supply system SYS, the state where any of the target transistors 32[1] to 32[3] is turned on so that the monitoring target voltage Vpg is lower than the criteria voltage Vth1 is the first abnormal state. In the first abnormal state, any of the output voltages Vout[1] to Vout[3] is abnormally low. Mainly just after the power supply system SYS is activated, the first abnormal state is observed.

In the power supply system SYS, the state where Vth2<Vpg<Vdd is satisfied is the second abnormal state. In the second abnormal state, a connection failure has occurred between the wiring WRpg and one or more of the power good terminals PG[1] to PG[3].

Note that in the state where a connection failure has occurred, if any of the target transistors 32[1] to 32[3] is turned on, Vpg<Vth1 or Vth2<Vpg is satisfied depending on a position where the connection failure has occurred. In any case, the comparison determination circuit 50 determines that the state is not normal.

On the basis of the comparison result of the comparator 51, the comparison determination circuit 50 outputs a predetermined normal determination signal as the signal SS if Vth1<Vpg<Vth2 is satisfied, while it outputs a predetermined abnormal determination signal as the signal SS if Vpg<Vth1 or Vth2<Vpg is satisfied. If Vpg=Vth1 or Vpg=Vth2 is satisfied, one of the normal determination signal and the abnormal determination signal is output as the signal SS.

The normal determination signal indicates that the power supply system SYS is in the normal state. The abnormal determination signal indicates that the power supply system SYS is in the first abnormal state or the second abnormal state. The abnormal determination signal may be the same between the condition of Vpg<Vth1 and the condition Vth2<Vpg. In this case, which one of the conditions Vpg<Vth1 and Vth2<Vpg is the factor causing the output of the abnormal determination signal is not discriminated.

When the abnormal determination signal is output from the comparison determination circuit 50, the power supply system SYS performs a predetermined abnormality response process. In the abnormality response process, the power supply management device 2 outputs a predetermined error signal to a microcomputer or the like constituting a host system (not shown). The error signal is a signal that informs that the first or second abnormal state has occurred. Alternatively, for example, in the abnormality response process, the power supply management device 2 may temporarily stops operation of the power supply ICs 10[1] to 10[3], and then restarts the same.

According to this example, it is possible to detect a connection failure (unsoldering or the like) of the power good terminal, which was difficult to detect. The process for this detection can be constantly performed during operation of the power supply system SYS. In FIG. 7, n=3 is supposed, but the comparator having two threshold values (Vth1 and Vth2) can perform the detection described above, by appropriately setting the resistance value of the pull-up resistor Rpu in accordance with the value of n that is the number of power supply ICs 10 connected to the wiring WRpg.

Figure 9:
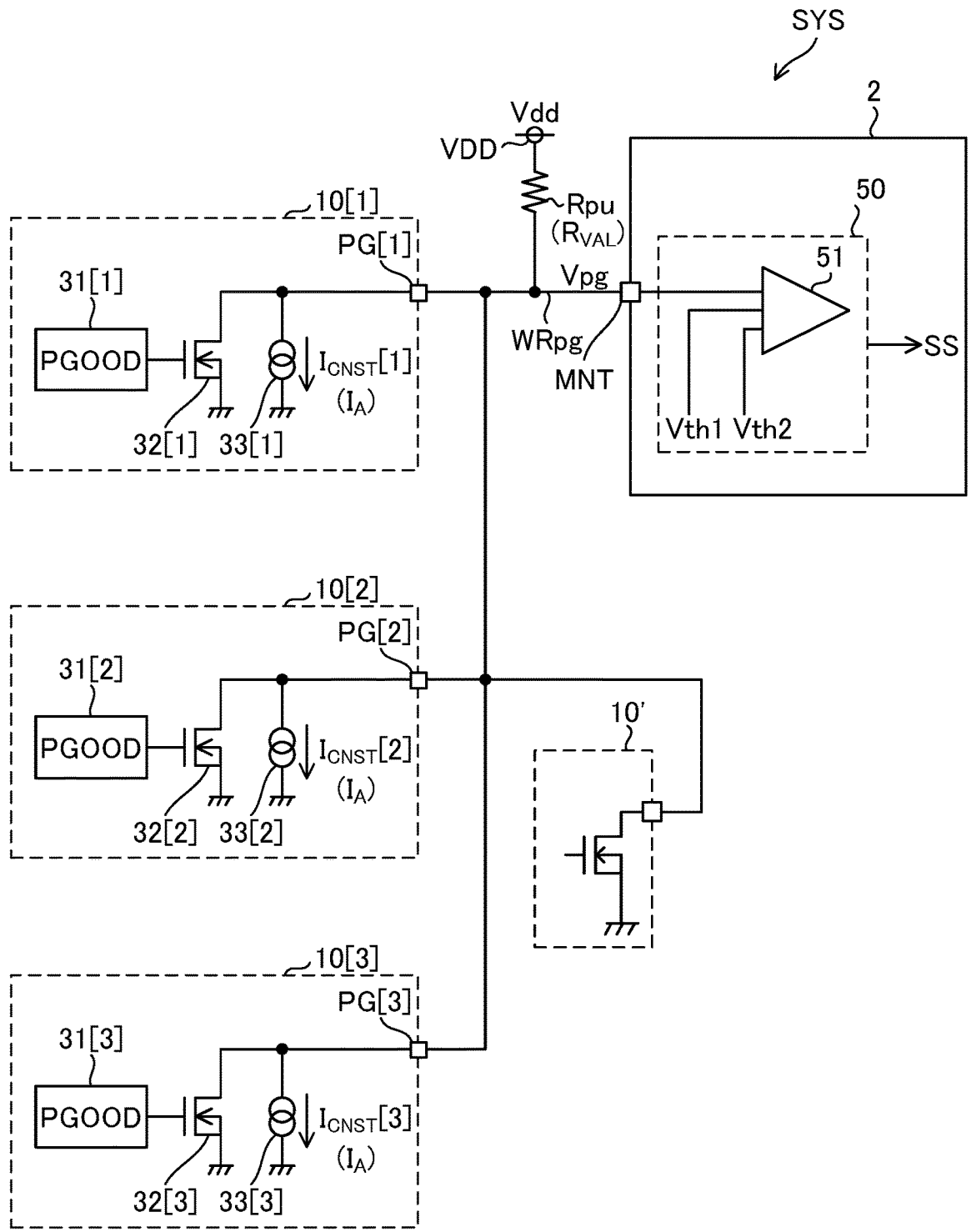
FIG. 9 is a partial structural diagram of the power supply system to which a device that does not support the present disclosure is added in the first example according to the embodiment of the present disclosure.

In addition, as illustrated in FIG. 9, the power supply IC 10 that supports the present disclosure and a device 10' that does not support the present disclosure may be mixed in the power supply system SYS. In the device 10', the constant current circuit is not disposed in parallel to the transistor having an open drain structure. In the structure of FIG. 9, connection failure of the device 10' cannot be detected, but connection failure of each power supply IC 10 can be detected.

Second Example

A second example is described below. The second example describes a variation technique of the first example.

Supposing the structure described above in the first example, on the basis of the comparison result of the comparator 51, the comparison determination circuit 50 may output the predetermined normal determination signal as the signal SS if Vth1<Vpg<Vth2 is satisfied, may output the predetermined first abnormal determination signal as the signal SS if Vpg<Vth1 is satisfied, and may output the predetermined second abnormal determination signal as the signal SS if Vth2<Vpg is satisfied. The first and second abnormal determination signals are different from each other. If Vpg=Vth1 is satisfied, one of the normal determination signal and the first abnormal determination signal is output as the signal SS. If Vpg=Vth2 is satisfied, one of the normal determination signal and the second abnormal determination signal is output as the signal SS.

The first and second abnormal determination signals are two types of abnormal determination signals that can be discriminated from each other. The first abnormal determination signal indicates that the power supply system SYS is in the first abnormal state, while second abnormal determination signal indicates that the power supply system SYS is in the second abnormal state.

According to the second example, the first abnormal state and the second abnormal state can be detected in a discriminated manner. By detecting the first and second abnormal states in a discriminated manner, a content of the abnormality/failure can be recognized in detail, and hence the abnormality response process appropriate for the content of abnormality/failure can be performed.

Third Example

A third example is described below. In the first or second example, n=3 is supposed for specific description, but the number of the power supply ICs 10 incorporated in the power supply system SYS (i.e. the value of n) can be any number more than one.

The constant currents $I_{CNST}[1]$ to $I_{CNST}[n]$ may have the same value. If the constant currents $I_{CNST}[1]$ to $I_{CNST}[n]$ all have the same current value $I_A$, the values of the criteria voltages Vth1 and Vth2 and the value of the pull-up resistor Rpu are set so that $0<Vth1<Vdd-n\times I_A\times R_{VAL}<Vth2<Vdd$ is satisfied, and that the monitoring target voltage Vpg when any of the target transistors 32[1] to 32[n] is turned on in the state without a connection failure is lower than the criteria voltage Vth1.

Fourth Example

A fourth example is described below. The constant currents $I_{CNST}[1]$ to $I_{CNST}[n]$ may have different values. In this way, when a connection failure occurs, it is possible to determine which one of the power good terminals PG[1] to PG[n] has the connection failure.

Figure 10:
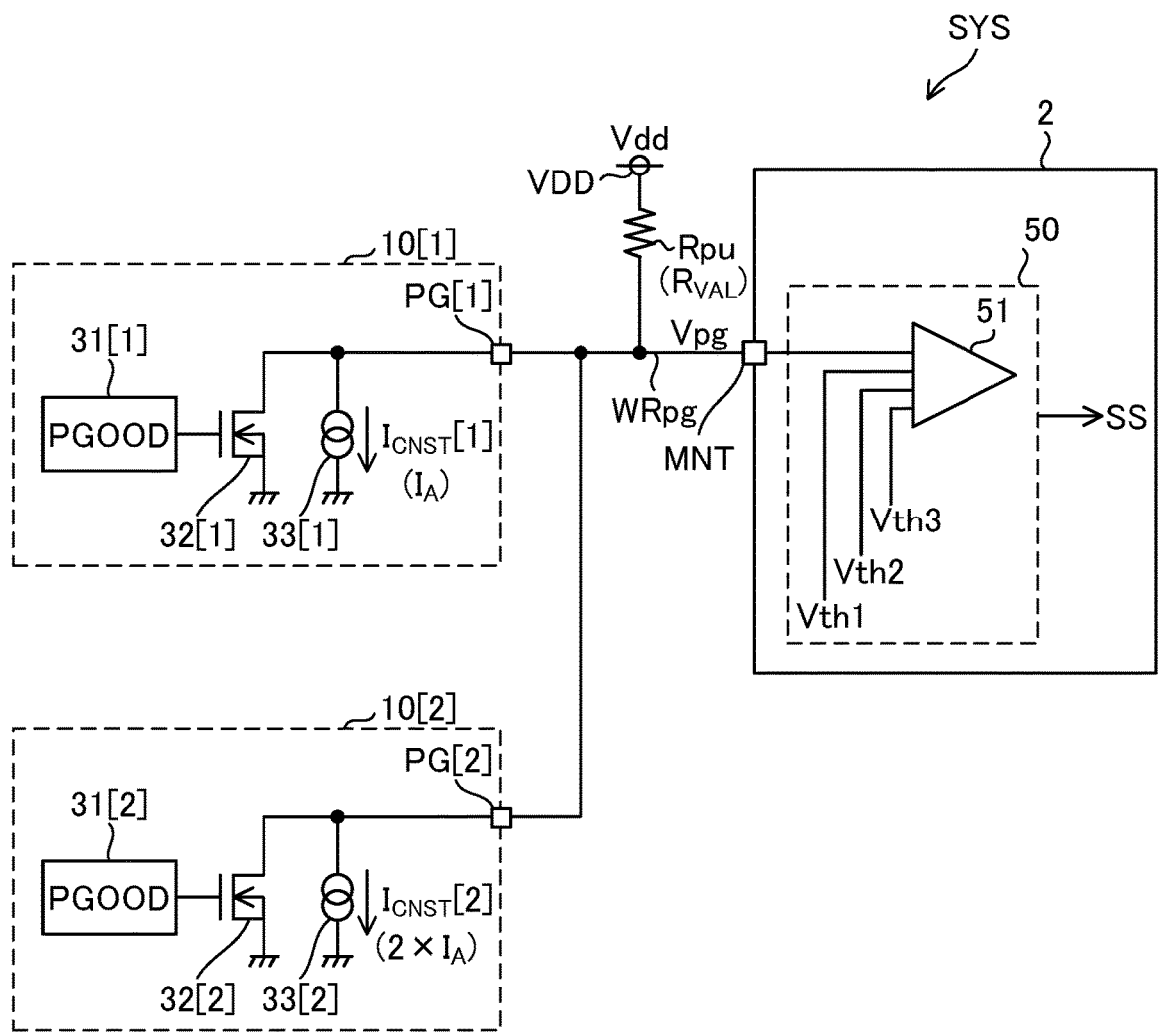
FIG. 10 is a partial structural diagram of the power supply system in a fourth example according to the embodiment of the present disclosure.

As an example of the structure that realizes the determination, a structure illustrated in FIG. 10 is described below. In the structure of FIG. 10, a case is supposed in which n is 2, the constant current $I_{CNST}[1]$ has the current value $I_A$, and the constant current $I_{CNST}[2]$ has the value twice the current value $I_A$. In this case, the comparator 51 sets different criteria voltages Vth1 to Vth3 and compares the monitoring target voltage Vpg with each of the criteria voltages Vth1 to Vth3. The comparison determination circuit 50 outputs the signal SS corresponding to the comparison result of the comparator 51.

Figure 11:
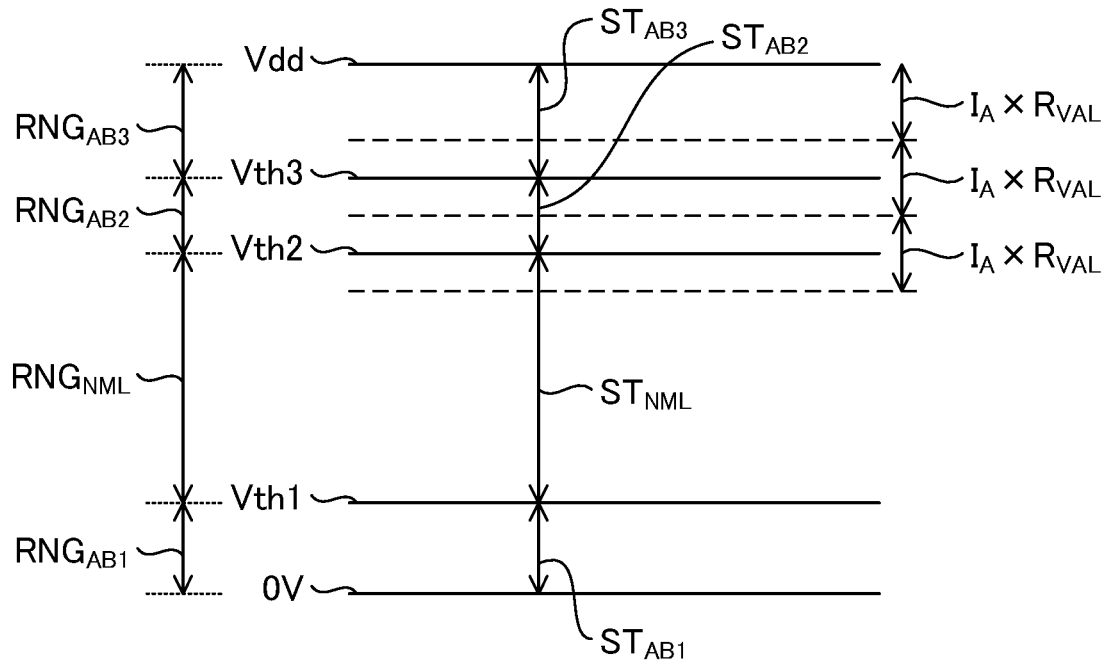
FIG. 11 is a diagram illustrating a high-low relationship among a plurality of voltages in the fourth example according to the embodiment of the present disclosure.

FIG. 11 illustrates a high-low relationship among the power supply voltage Vdd (e.g. 5 V), the reference potential voltage (i.e. 0 V), and the criteria voltages Vth1 to Vth3. The criteria voltage Vth1 has a predetermined first voltage value (e.g. 1.5 V) higher than 0 V, the criteria voltage Vth2 has a predetermined second voltage value (e.g. 3.0 V) higher than the criteria voltage Vth1, the criteria voltage Vth3 has a predetermined third voltage value (e.g. 4.0 V) that is higher than the criteria voltage Vth2 and is lower than the power supply voltage Vdd.

Here, the values of the criteria voltages Vth1 to Vth3 and the value of the pull-up resistor Rpu are set so that $0 < Vth1 < Vdd - 3 \times I_A \times R_{VAL} < Vth2 < Vdd - 2 \times I_A \times R_{VAL} < Vth3 < Vdd - I_A \times R_{VAL}$ is satisfied, and that the monitoring target voltage Vpg when one of the target transistors 32[1] and 32[2] is turned on in the state without a connection failure is lower than the criteria voltage Vth1.

The voltage range from the reference potential voltage (i.e. 0 V) to the power supply voltage Vdd is divided into four voltage ranges by the criteria voltages Vth1 to Vth3 as boundaries. The four voltage ranges include a normal voltage range $RNG_{NML}$ and abnormality voltage ranges $RNG_{AB1}$ to $RNG_{AB3}$, as illustrated in FIG. 11.

The abnormality voltage range $RNG_{AB1}$ is a voltage range of 0 V or more and lower than the criteria voltage Vth1. The normal voltage range $RNG_{NML}$ is a voltage range higher than the criteria voltage Vth1 and lower than the criteria voltage Vth2. The abnormality voltage range $RNG_{AB2}$ is a voltage range higher than the criteria voltage Vth2 and lower than the criteria voltage Vth3. The abnormality voltage range $RNG_{AB3}$ is a voltage range higher than the criteria voltage Vth3 and lower than or equal to the power supply voltage Vdd. The criteria voltage Vth1 is classified into one of the voltage ranges $RNG_{AB1}$ and $RNG_{NML}$. The criteria voltage Vth2 is classified into one of the voltage ranges $RNG_{NML}$ and $RNG_{AB2}$. The criteria voltage Vth3 is classified into one of the voltage ranges $RNG_{AB2}$ and $RNG_{AB3}$.

Under supposition of the fourth example described above, in a normal state $ST_{NML}$ of the power supply system SYS, any of the connection failures described above has not occurred, and the target transistors 32[1] and 32[2] are turned off. Therefore, $Vpg = Vdd - 3 \times I_A \times R_{VAL}$ is satisfied. In other words, in the normal state $ST_{NML}$, the monitoring target voltage Vpg is within the normal voltage range $RNG_{NML}$.

The state where one of the target transistors 32[1] and 32[2] is turned on when the connection failure described above has not occurred is an abnormal state STAB' of the power supply system SYS, in which Vpg<Vth1 is satisfied. In other words, in the abnormal state $ST_{AB1}$, the monitoring target voltage Vpg is within the abnormality voltage range $RNG_{AB1}$.

The state where Vth2<Vpg<Vth3 is satisfied, i.e. the state where the monitoring target voltage Vpg is within the abnormality voltage range $RNG_{AB2}$ corresponds to an abnormal state $ST_{AB2}$, in which the constant current $I_{CNST}[1]$ of the current value $I_A$ does not flow through the power good terminal PG[1], and the constant current $I_{CNST}[2]$ of the current value ($2 \times I_A$) flows through the power good terminal PG[2]. In the abnormal state $ST_{AB2}$, the power good terminal PG[2] and the wiring WRpg are connected to each other, but a connection failure has occurred so that the power good terminal PG[1] and the wiring WRpg are disconnected.

The state where Vth3<Vpg≤Vdd is satisfied, i.e. the state where the monitoring target voltage Vpg is within the abnormality voltage range $RNG_{AB3}$ corresponds to the abnormal state $ST_{AB3}$ in which the constant current $I_{CNST}[2]$ of the current value ($2 \times I_A$) does not flow through the power good terminal PG[2]. In the abnormal state $ST_{AB3}$, at least a connection failure has occurred so that the power good terminal PG[2] and the wiring WRpg are disconnected.

Under supposition of the fourth example described above, on the basis of the comparison result of the comparator 51 between the monitoring target voltage Vpg and criteria voltages Vth1 to Vth3, the comparison determination circuit 50 outputs the normal determination signal $S_{NML}$ as the signal SS if the monitoring target voltage Vpg is within the normal voltage range $RNG_{NML}$, and outputs the abnormal determination signals $S_{AB1}$, $S_{AB2}$, or $S_{AB3}$ as the signal SS if the monitoring target voltage Vpg is within the abnormality voltage ranges $RNG_{AB1}$, $RNG_{AB2}$, or $RNG_{AB3}$, respectively.

The normal determination signal $S_{NML}$ indicates that the power supply system SYS is in the normal state $ST_{NML}$. The abnormal determination signal $S_{AB1}$, $S_{AB2}$, or $S_{AB3}$ indicates that the power supply system SYS is in the abnormal states $ST_{AB1}$, $ST_{AB2}$, or $ST_{AB3}$, respectively. In this way, by detecting the abnormal states $ST_{AB1}$, $ST_{AB2}$ and $ST_{AB3}$ in a discriminated manner, a content of the abnormality/failure can be recognized in detail, and hence the abnormality response process appropriate for the content of abnormality/failure can be performed.

Note that in addition to the criteria voltages Vth1 to Vth3 described above, a criteria voltage Vth4 that satisfies $Vdd - I_A \times R_{VAL} < Vth4 < Vdd$ may be also used so that the monitoring target voltage Vpg is compared with each of the criteria voltages Vth1 to Vth4. Then, the abnormal state $ST_{AB3}$ can be divided into two abnormal states including: an abnormal state $ST_{AB3\_a}$ in which the constant current $I_{CNST}[1]$ of the current value $I_A$ does not flow through the power good terminal PG[1], and the constant current $I_{CNST}[2]$ of the current value ($2 \times I_A$) does not flow through the power good terminal PG[2]; and an abnormal state $ST_{AB3\_b}$ in which the constant current $I_{CNST}[1]$ of the current value $I_A$ flows through the power good terminal PG[1], but the constant current $I_{CNST}[2]$ of the current value ($2 \times I_A$) does not flow through the power good terminal PG[2]. In the abnormal state $ST_{AB3\_a}$, two connection failures have occurred; in one failure, the power good terminal PG[1] and the wiring WRpg are disconnected, and in the other failure the power good terminal PG[2] and the wiring WRpg are disconnected. In the abnormal state $ST_{AB3\_b}$, the power good terminal PG[1] and the wiring WRpg are connected, but the connection failure in which the power good terminal PG[2] and the wiring WRpg are disconnected has occurred.

The specific example of FIGS. 10 and 11 is described above supposing that n is 2, but the value of n can be any integer more than 1 also in the case where the constant currents $I_{CNST}[1]$ to $I_{CNST}[n]$ have different current values. In this case, the comparator 51 should compare the monitoring target voltage Vpg with each of the three or more criteria voltages. The three or more criteria voltages are different voltages within a voltage range from the reference potential voltage (i.e. 0 V) to the power supply voltage Vdd, which is divided into four or more voltage ranges by the three or more criteria voltages as boundaries (in the example of FIG. 11, it is divided into the voltage ranges $RNG_{AB1}$ to $RNG_{AB3}$ and $RNG_{NML}$ by the criteria voltages Vth1 to Vth3 as boundaries). The comparison determination circuit 50 compares the monitoring target voltage Vpg with each of the three or more criteria voltages, so as to determine which one of the four or more voltage ranges described above the monitoring target voltage Vpg belongs to, and outputs the signal SS corresponding to the determination result.

Fifth Example

A fifth example is described below. The fifth example can be combined with any one of the first to fourth example described above.

Figure 12:
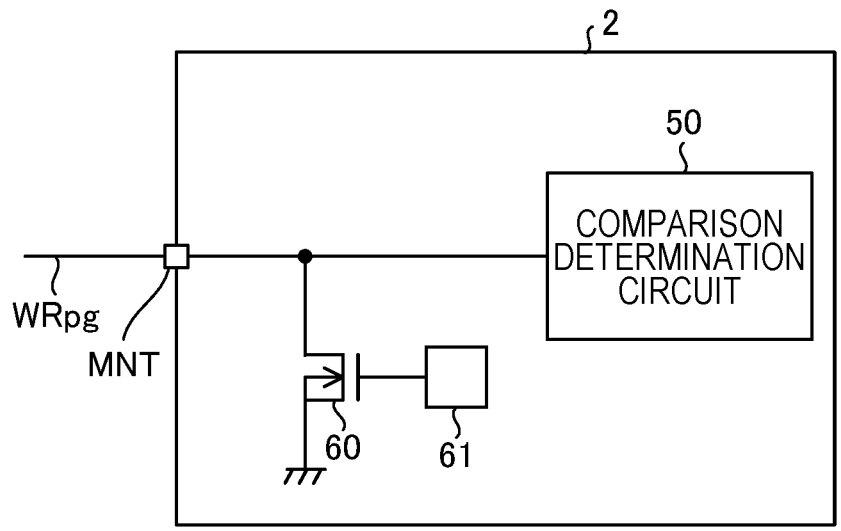
FIG. 12 is a diagram illustrating a partial structure of a power supply management device in a fifth example according to the embodiment of the present disclosure.
Figure 13:
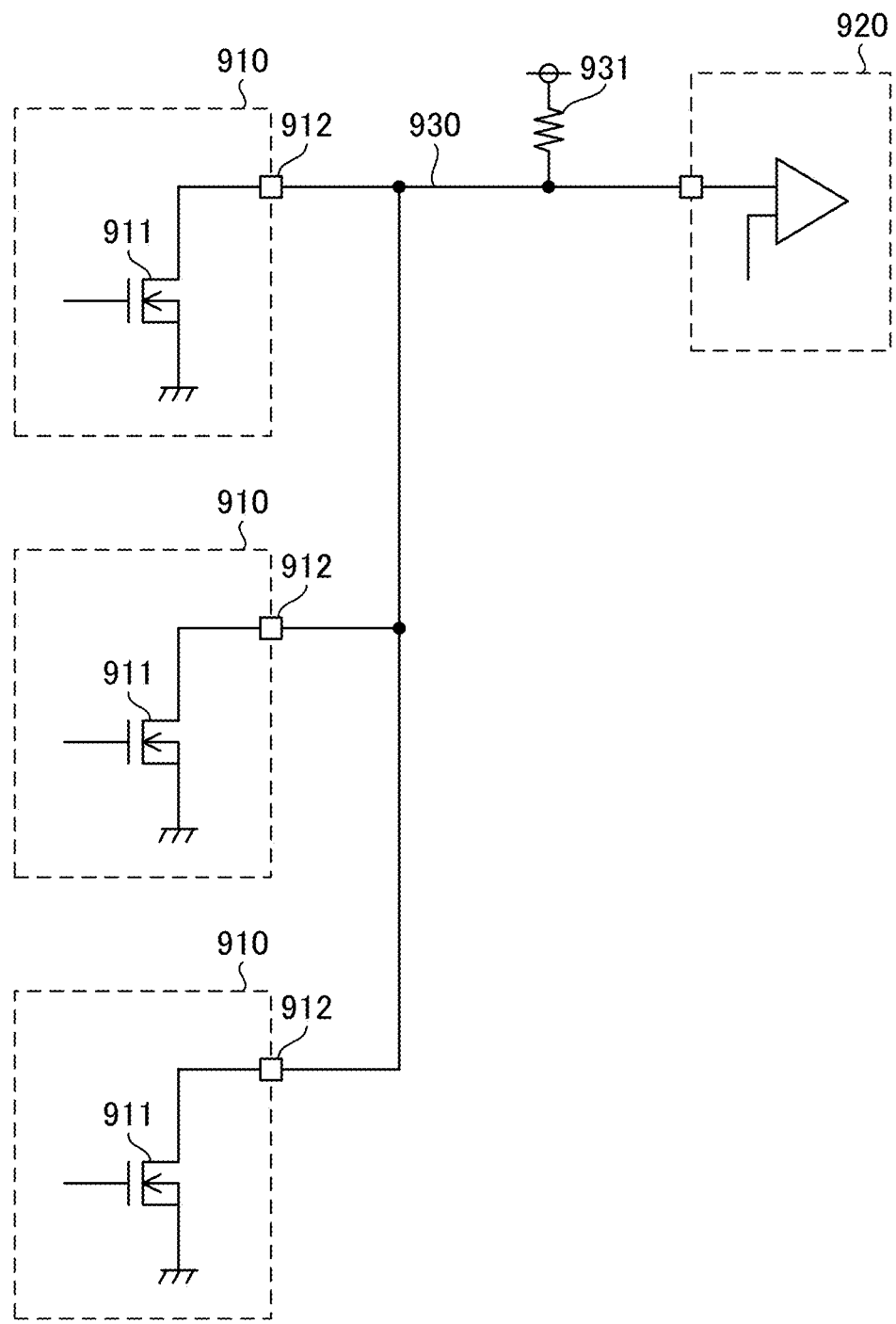
FIG. 13 is a diagram illustrating a structure of the power supply system according to a reference technique.

As illustrated in FIG. 12, a transistor 60 having an open drain structure and a circuit 61 that turns on or off the transistor 60 may be disposed in the power supply management device 2. The transistor 60 is constituted as an N-channel type MOSFET, a drain of the transistor 60 is connected to the monitoring terminal MNT, and a source of the same is connected to the ground. The circuit 61 basically makes off the transistor 60, monitors whether or not a predetermined abnormality (such as a temperature abnormality) has occurred in the power supply management device 2 itself, and turns on the transistor 60 only when detecting that a predetermined abnormality has occurred in the power supply management device 2 itself. When the transistor 60 is turned on, the monitoring target voltage Vpg becomes lower than the criteria voltage Vth1 without depending on the states of the target transistors 32[1] to 32[n] of the power supply ICs 10[1] to 10[n].

As the transistor 60 and circuit 61 are disposed, it is possible to determine, based on the monitoring target voltage Vpg, whether or not the entire power supply system SYS including the power supply management device 2 has an abnormality. If a device (not shown) that monitors the monitoring target voltage Vpg is connected to the wiring WRpg separately from the power supply management device 2, it is possible to determine using the device whether or not the entire power supply system SYS including the power supply management device 2 has an abnormality. In addition, it can also be used by a valuator to observe the monitoring target voltage Vpg in trial manufacture and evaluation of the power supply system SYS.

Sixth Example

A sixth example is described below. The power supply system SYS described above may be mounted in a vehicle such as an automobile. In this case, the output voltage Vout[i] that is one of the output voltages Vout[1] to Vout[n] is supplied to an arbitrary electronic device mounted in the vehicle, and the electronic device operates based on the supplied output voltage Vout[i]. The electronic device that operates based on one of the output voltages Vout[1] to Vout[n] is, for example, a navigation device, a digital meter, an air bag, various electronic control units (ECUs), a sensor, or components constituting an advanced drive support system.

Note that the power supply system SYS can be used in any application without limiting to the in-vehicle application, and it can be mounted in any electronic device.

Seventh Example

A seventh example is described below.

In each power supply IC 10, the target transistor 32 may be constituted of an NPN bipolar transistor. In this case, the drain, source, and gate of the target transistor 32 in the above description are read as collector, emitter, and base, respectively, and the collector and emitter of the target transistor 32 are connected to the power good terminal PG and the ground, respectively. In each power supply IC 10, even if the target transistor 32 is constituted of the bipolar transistor, the power good circuit 31 operates as described above, and the power good circuit 31 drives the base of the target transistor 32 so as to turn on or off the target transistor 32.

Similarly, the transistor 60 of FIG. 12 may also be constituted of an NPN bipolar transistor. In this case, the drain, source, and gate of the transistor 60 in the above description are read as collector, emitter, and base, respectively, and the collector and emitter of the transistor 60 are connected to the monitoring terminal MNT and the ground, respectively. Even if the transistor 60 is constituted of the bipolar transistor, the circuit 61 operates as described above, and the circuit 61 drives the base of the transistor 60 so as to turn on or off the transistor 60.

For any signal or voltage, a relationship between high level and low level may be inverted without impairing the spirit of the above description.

The embodiment of the present disclosure is described above noting the power good terminal of the power supply IC, but the present disclosure can be widely applied to any semiconductor device having the open drain structure or an open collector structure. The semiconductor device according to the present disclosure may be a semiconductor integrated circuit for power supply that is embodied with the power supply IC 10, or may be an LED driver, a motor driver, a memory, or a microcomputer, for example. The device according to the present disclosure (e.g. a semiconductor device) is preferably a device equipped with, for example, a plurality of external terminals including a target external terminal (corresponding to the terminal PG described above), a target transistor (corresponding to the transistor 32 described above) disposed between the target external terminal and ground, and a circuit (corresponding to the circuit 31 described above) that determines normality/abnormality of a monitoring target, and turns on or off the target transistor in accordance with a determination result. The monitoring target in the power supply IC 10 is the output voltage Vout, and in the present disclosure, the monitoring target is any one of voltage, current, temperature, signal, data, and the like.

<<Consideration of Present Disclosure>>

The present disclosure with the embodiment described above is considered below.

A semiconductor integrated circuit for power supply according to an aspect of the present disclosure is a semiconductor integrated circuit for power supply (e.g. the power supply IC 10) arranged to form a power supply device that generates an output voltage from an input voltage, and is equipped with a plurality of external terminals including a target external terminal (e.g. the power good terminal PG), a target transistor (e.g. the transistor 32) disposed between the target external terminal and a reference conductive part (e.g. a ground) having a predetermined reference potential, an output voltage monitoring circuit (e.g. the power good circuit 31) that turns on or off the target transistor in accordance with the output voltage, and a constant current circuit (e.g. the constant current circuit 33) that supplies a constant current to a point of the reference potential via the target external terminal.

In the present disclosure, the target transistor is an arbitrary transistor having an open drain structure or an open collector structure, and the target external terminal is an arbitrary external terminal connected to the target transistor.

A power supply system according to an aspect of the present disclosure is a power supply system equipped with a plurality of power supply devices including the semiconductor integrated circuit for power supply described above so as to generate an output voltage from an input voltage, and includes a target wiring (e.g. the wiring WRpg) to be commonly connected to a plurality of target external terminals provided to a plurality of semiconductor integrated circuits for power supply of the plurality of power supply devices, a pull-up resistor (e.g. the resistor Rpu) connected between the target wiring and an application terminal of a predetermined positive power supply voltage, and a power supply management device (e.g. the power supply management device 2) that monitors a voltage (e.g. the voltage Vpg) of the target wiring as a monitoring target voltage. The power supply management device includes a comparison determination circuit (e.g. the comparison determination circuit 50) that compares the monitoring target voltage with a plurality of criteria voltages.

The embodiment of the present disclosure can be variously modified appropriately within the scope of the technical concept recited in the claims. The embodiment described above is merely an example of the embodiment of the present disclosure. The present disclosure and meanings of terms of the structural elements are not limited to those described in the above embodiment. The specific values indicated in the above description are merely examples and can be changed to various values, as a matter of course.

The invention claimed is:

1. A power supply system comprising a plurality of power supply devices each power supply device including a respective semiconductor integrated circuit for power supply, wherein
each power supply device of the plurality of power supply devices is configured to generate a respective output voltage from a respective input voltage provided to the power supply device,
each semiconductor integrated circuit for power supply including:
a plurality of external terminals including a target external terminal;
a target transistor disposed between the target external terminal and a reference conductive part having a predetermined reference potential;
an output voltage monitoring circuit arranged to turn on or off the target transistor in accordance with the output voltage of the power supply device to which the semiconductor integrated circuit belongs; and
a constant current circuit arranged to supply a constant current to a point of the predetermined reference potential via the target external terminal,
the power supply system further including:
a target wiring commonly connected to a plurality of the target external terminals;
a pull-up resistor connected between the target wiring and an application terminal of a predetermined positive power supply voltage; and
a power supply management device arranged to monitor voltage of the target wiring as a monitoring target voltage, wherein
the power supply management device includes a comparison determination circuit arranged to compare the monitoring target voltage with a plurality of criteria voltages.

2. The power supply system according to claim 1, wherein the output voltage monitoring circuit of each power supply device is configured to determine normality or abnormality of the output voltage of the power supply device, to turn off the target transistor when determining that the output voltage of the power supply device is normal, and to turn on the target transistor when determining that the output voltage of the power supply device is abnormal.

3. The power supply system according to claim 2, wherein the output voltage monitoring circuit of each power supply device is configured to turn on or off the target transistor based on a high-low relationship between a set voltage and a feedback voltage corresponding to the output voltage of the power supply device.

4. The power supply system according to claim 2, wherein
the plurality of criteria voltages include a first criteria voltage having a potential higher than the predetermined reference potential and a second criteria voltage higher than the first criteria voltage and lower than the predetermined positive power supply voltage, and
on the basis of comparison results between the monitoring target voltage and the first criteria voltage and between the monitoring target voltage and the second criteria voltage, the comparison determination circuit is configured to output a normal determination signal when the monitoring target voltage is higher than the first criteria voltage and is lower than the second criteria voltage, and to output an abnormal determination signal when the monitoring target voltage is lower than the first criteria voltage or is higher than the second criteria voltage.

5. The power supply system according to claim 4, wherein the comparison determination circuit is configured to output a first abnormal determination signal when the monitoring target voltage is lower than the first criteria voltage, and to output a second abnormal determination signal different from the first abnormal determination signal when the monitoring target voltage is higher than the second criteria voltage.

6. The power supply system according to claim 1, wherein the constant current circuits disposed in semiconductor integrated circuits for power supply are configured to generate the constant currents having the same current value.

7. The power supply system according to claim 1, wherein the constant current circuits disposed in the semiconductor integrated circuits for power supply are configured to generate the constant currents having different current values.

8. The power supply system according to claim 7, wherein the plurality of criteria voltages are three or more different criteria voltages within a voltage range from the predetermined reference potential to the predetermined positive power supply voltage.

9. The power supply system according to claim 8, wherein
the voltage range is divided into four or more voltage ranges by the three or more different criteria voltages as boundaries, and
the comparison determination circuit is configured to compare the monitoring target voltage with the three or more different criteria voltages so as to determine which one of the four or more voltage ranges the monitoring target voltage belongs to, and to output a signal corresponding to a determination result.

* * * * *